United States Patent
Park

[11] Patent Number: 5,814,237
[45] Date of Patent: Sep. 29, 1998

[54] METHOD FOR FORMING DEFLECTION GRATING

[75] Inventor: Chong-Dae Park, Daejeon, Rep. of Korea

[73] Assignees: Electronics and Telecommunications Research Institute, Daejeon; Korea Telecommunication Authority, Seoul, both of Rep. of Korea

[21] Appl. No.: 721,337

[22] Filed: Sep. 26, 1996

[51] Int. Cl.$^6$ ..................................................... H01L 21/00
[52] U.S. Cl. ................. 216/24; 216/49; 216/51; 216/75; 430/64; 430/72; 430/321
[58] Field of Search ................... 216/24, 49, 51, 216/75; 430/321; 437/225

[56] References Cited

U.S. PATENT DOCUMENTS 4,927,785  5/1990  Theetan et al. ........................... 437/225

FOREIGN PATENT DOCUMENTS 0619602  10/1994  European Pat. Off. .

*Primary Examiner*—Yogendra N. Gupta
*Attorney, Agent, or Firm*—Antonelli, Terry, Stout & Kraus, LLP

[57] ABSTRACT

A method for forming a deflection grating is disclosed, includes the steps of: sequentially forming a dielectric layer and photoresist layer on a compound semiconductor substrate, and patterning the photoresist layer through optical holography to expose the dielectric layer; removing a portion of the dielectric layer on which the patterned photoresist layer is not formed, through RIE using the patterned photoresist layer as a mask; anisotropically etching a portion of the semiconductor substrate on which the dielectric layer is not formed, through RIE using the dielectric layer as a mask, to form a deflection grating; and removing the dielectric layer.

8 Claims, 3 Drawing Sheets

METHOD FOR FORMING DEFLECTION GRATING

BACKGROUND OF THE INVENTION

The present invention relates to a method for forming a deflection grating, and more particularly, to a method for forming a deflection grating of a distributed feedback laser diode (DFB-LD) used as a luminescent device in long distance communication.

Recently, as high-speed wide-band communication is increasingly required, a light source used for an optical communication has been improved. In particular, a method for forming a primary deflection grating for an InP group DFB-LD has been studied for a long time. InP group DFB-LD having an oscillation wavelength of 1.55 $\mu$m is used for long distance optical communication. The method for forming a deflection grating is roughly divided into optical holography and electron beam lithography according to a photoresist pattern formation method. The optical holography includes a wet etching method, and a method in which a metal like Cr or Ti is lifted off and reactive ion etching (RIE) is carried out using the metal.

However, in case of the optical holography using the wet etching method, a fabricated deflection grating is triangular, and its depth cannot exceed 90 mm. In case of the method using Cr or Ti, it is not possible to form a primary deflection grating having a short deflection grating cycle because the lift-off technique using the optical holographic exposure reaches its limit. Also, an electron beam should be used in order to obtain the primary deflection grating. Accordingly, it takes much time to fabricate the primary deflection grating. Furthermore, for the method using the electron beam, it takes much time to directly draw the image of the deflection grating although it is able to control the shape of the deflection grating, and use RIE etching.

FIGS. 1A and 1B show a conventional method for forming a deflection grating using the optical holography. Referring to FIG. 1A, a photoresist 13 is coated on an n-type InP semiconductor substrate 11, and exposed and developed through the optical holography to form a photoresist pattern 13, thereby selectively exposing semiconductor substrate 11. Here, since the photoresist is selectively exposed due to interference and reinforcement of light during the optical holography, the photoresist is patterned by the development.

Referring to FIG. 1B, the exposed portion of semiconductor substrate 11 is isotropically etched through wet etching using photoresist pattern 13 as a mask, to form a deflection grating 15. Then, photoresist pattern 13 is removed. In the aforementioned conventional method for forming a deflection grating, since the photoresist is patterned through the optical holography, time required to fabricate the deflection grating is short. However, the deflection grating formed by wet etching is triangular, and its depth is limited to 800–1000Å. Also, it is difficult to control its duty rate. Furthermore, because the semiconductor substrate is isotropically etched through wet etching, the deflection grating cannot be formed deeply.

FIGS. 2A, 2B and 2C show another conventional method for forming a deflection grating using electron beam. Referring to FIG. 2A, a dielectric layer 23 and photoresist layer 25 are sequentially formed on an n-type InP semiconductor substrate 21. Photoresist layer 25 is exposed by an electron beam and developed to form photoresist pattern 25. Referring to FIG. 2B, a portion of dielectric layer 23 on which photoresist pattern 25 is not formed is selectively removed through RIE using photoresist pattern 25 as a mask, to selectively expose semiconductor substrate 21. Here, when dielectric layer 23 is removed, the etch selectivity of dielectric layer 23 and photoresist layer 25 is controlled so as to etch dielectric layer 23 faster than photoresist layer 25. By doing so, photoresist pattern 25 is prevented from being damaged. Thereafter, photoresist pattern 25 is removed.

Referring to FIG. 2C, a portion of semiconductor substrate 21 on which dielectric layer 23 is not formed is anisotropically etched through RIE using dielectric layer 23 as a mask, to form a deflection grating 27. Then, dielectric layer 23 is removed. Here, deflection grating 27 is formed in a manner that the etch selectivity of dielectric layer 23 and substrate 21 is controlled so as to etch semiconductor substrate 21 faster than dielectric layer 23.

In the above-described conventional method for forming a deflection grating, the photoresist layer is exposed utilizing an electron beam and developed to form the photoresist pattern, and two-time RIE are carried out. Accordingly, the deflection grating has the vertical section, and its depth and duty rate can be optionally controlled. However, since the photoresist is exposed through electron beam, it requires long processing time.

SUMMARY OF THE INVENTION

It is an object of the present invention to provide a method for forming a deflection grating, which is capable of optionally controlling the depth and duty ratio of the deflection grating, and reducing its processing time.

To accomplish the object of the present invention, there is provided a method for forming a deflection grating, including the steps of: sequentially forming a dielectric layer and photoresist layer on a compound semiconductor substrate, and patterning the photoresist layer through optical holography to expose the dielectric layer; removing a portion of the dielectric layer on which the patterned photoresist layer is not formed, through RIE using the patterned photoresist layer as a mask; anisotropically etching a portion of the semiconductor substrate on which the dielectric layer is not formed, through RIE using the dielectric layer as a mask, to form a deflection grating; and removing the dielectric layer.

BRIEF DESCRIPTION OF THE ATTACHED DRAWINGS

The novel features of the invention, as well as other features and advantages thereof, will best be understood by reference to the following detailed description of a particular embodiment, read in conjunction with the accompanying drawings, wherein.

DETAILED DESCRIPTION OF PREFERRED EMBODIMENT

Figure 1A:
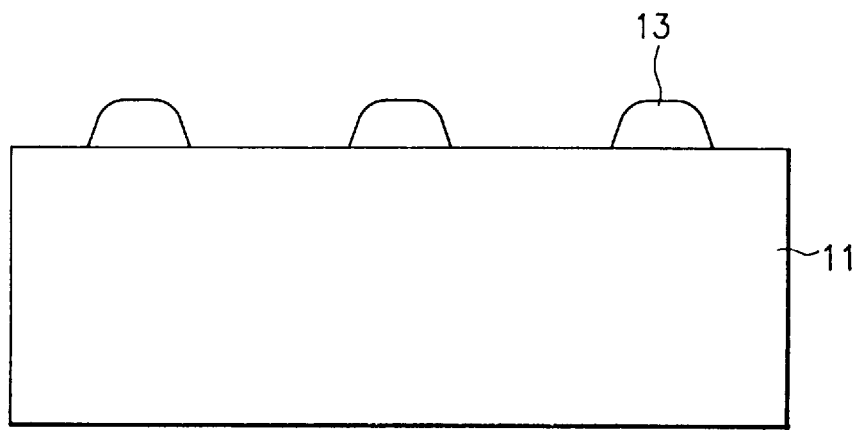
FIGS. 1A and 1B are cross-sectional views showing a conventional method for forming a deflection grating, using optical holography.
Figure 1B:
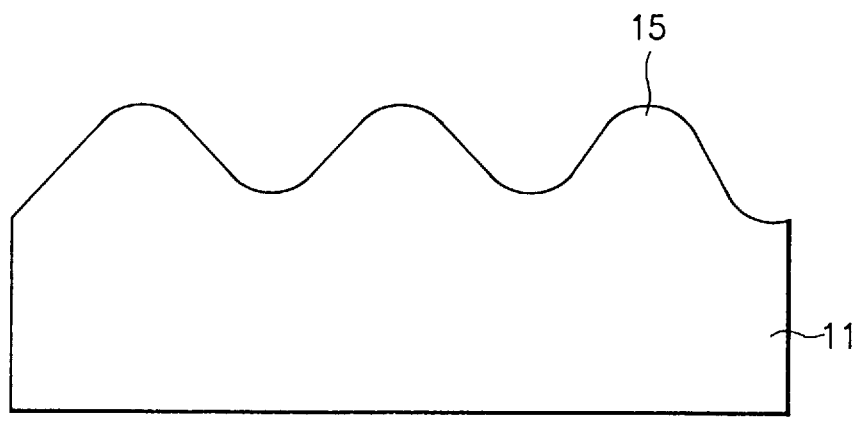
Figure 2A:
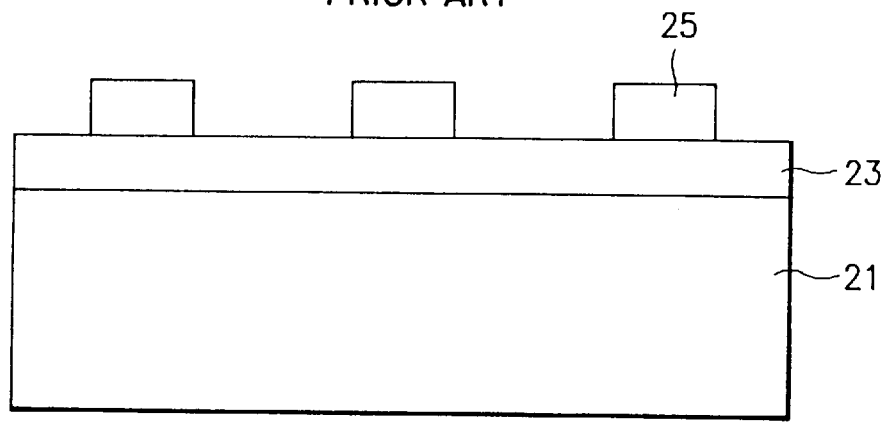
FIGS. 2A, 2B and 2C are cross-sectional views showing another conventional method for forming a deflection grating, using an electron beam.
Figure 2B:
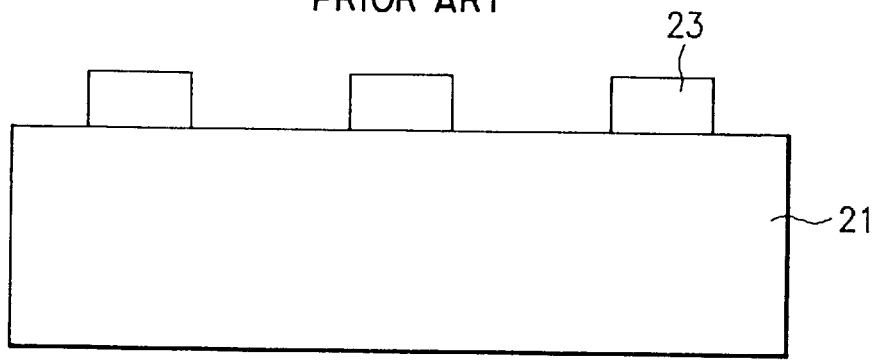
Figure 2C:
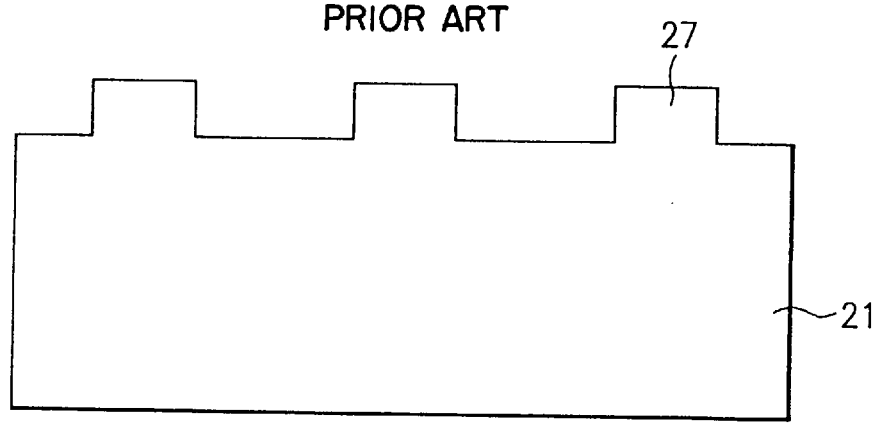
Figure 3A:
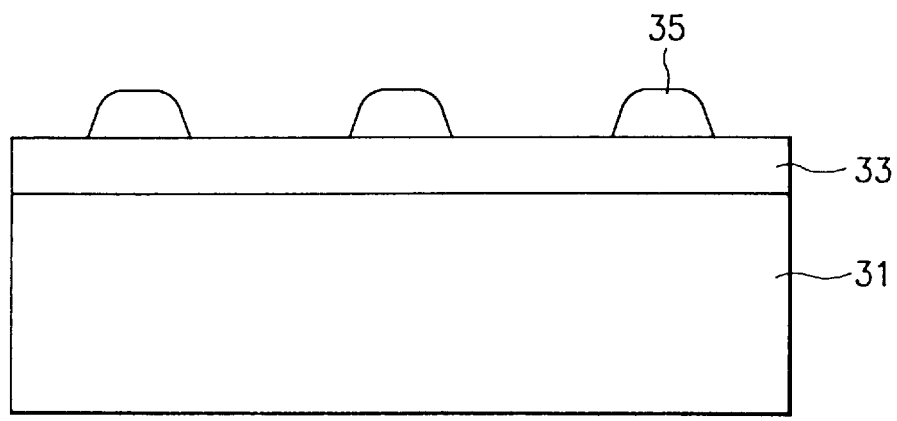
FIGS. 3A, 3B and 3C are cross-sectional views showing a method for forming a deflection grating according to the present invention.
Figure 3B:
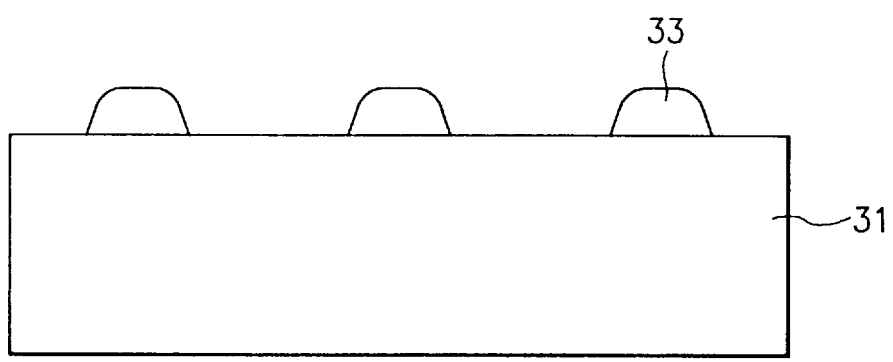
Figure 3C:
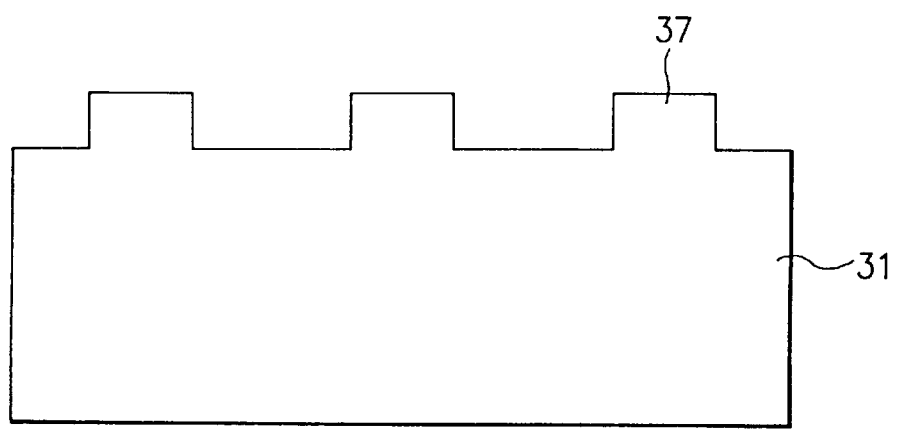

A preferred embodiment of the present invention will be explained below with reference to the accompanying drawings. FIGS. 3A, 3B and 3C are cross-sectional views showing a method for forming a deflection grating according to the present invention. Referring to FIG. 3A, a dielectric layer 33 and photoresist layer 35 are sequentially formed on an n-type InP semiconductor substrate 31. Dielectric layer 33 is formed in a manner that an oxide layer or nitride layer is formed by a thickness of 300 to 500Å through chemical vapor deposition (CVD). Photoresist layer 35 is formed by a thickness of 300 to 500Å through spin coating.

Photoresist layer 35 is exposed through optical holography and developed to form a photoresist pattern 35. By doing so, dielectric layer 33 is selectively exposed. Here, since photoresist layer 35 is selectively exposed due to the interference and reinforcement of light during optical holography, photoresist layer 35 is patterned by the development.

Referring to FIG. 3B, a portion of dielectric layer 33 on which photoresist pattern 35 is not formed is selectively removed through RIE using photoresist pattern 35 as a mask, to expose a portion of semiconductor substrate 31. Here, when dielectric layer 33 is removed, RF power of the RIE apparatus is reduced but its chamber pressure is increased to control the etch selectivity of photoresist layer 35 and dielectric layer 33 to 1:4. By doing so, dielectric layer 33 can be patterned without damaging photoresist pattern 35. Then, photoresist pattern 35 is removed.

Referring to FIG. 3C, the exposed portion of semiconductor substrate 31 is anisotropically etched through RIE using dielectric layer 33 as a mask, to form a deflection grating 37. Thereafter, dielectric layer 33 is removed. Here, semiconductor substrate 31 is etched using $CH_4/H_2$ to set the etch selectivity of dielectric layer 33 and semiconductor substrate 31 to 1:20, thereby preventing dielectric layer 33 from being damaged. At this time, since semiconductor substrate 31 is anisotropically etched, deflection grating 37 has the vertical section. Also, dielectric layer 33 is prevented from being damaged so that the depth and duty ratio of deflection grating 37 can be easily controlled.

In the aforementioned method for forming a deflection grating according to the present invention, the dielectric layer and photoresist layer are sequentially formed on the semiconductor substrate, and the photoresist layer is patterned through optical holography. Then, the dielectric layer is patterned through RIE using the patterned photoresist layer as a mask, and the semiconductor substrate is anisotropically etched through RIE using the dielectric layer as a mask to form the deflection grating. Thereafter, the dielectric layer is removed.

Accordingly, time required to form the deflection grating is reduced. Also, the deflection grating has the vertical section, and its depth and duty ratio can be easily controlled.

Therefore, it should be understood that the present invention is not limited to the particular embodiment disclosed herein as the best mode contemplated for carrying out the present invention, or that the present invention is not limited to the specific embodiments described in this specification except as defined in the appended claims.

What is claimed is:

1. A method for forming a deflection grating, comprising the steps of:

sequentially forming a dielectric layer and photoresist layer on a compound semiconductor substrate, and patterning said photoresist layer through optical holography to expose said dielectric layer;

removing a portion of said dielectric layer on which said patterned photoresist layer is not formed, through reactive ion etching (RIE) using said patterned photoresist layer as a mask;

anisotropically etching a portion of said semiconductor substrate on which said dielectric layer is not formed, through RIE using said dielectric layer as a mask, to form a deflection grating; and removing said dielectric layer.

2. The method for forming a deflection grating as claimed in claim 1, wherein said compound semiconductor substrate is formed of InP.

3. The method for forming a deflection grating as claimed in claim 1, wherein said dielectric layer is an oxide layer or nitride layer.

4. The method for forming a deflection grating as claimed in claim 3, wherein said dielectric layer is formed by a thickness of 300 to 500Å through chemical vapor deposition (CVD).

5. The method for forming a deflection grating as claimed in claim 1, wherein said photoresist layer is formed by a thickness of 300 to 500Å through spin coating.

6. The method for forming a deflection grating as claimed in claim 1, wherein, when said dielectric layer is removed, the RF power of RIE apparatus is reduced but its chamber pressure is increased to control the etch selectivity of said photoresist layer and said dielectric layer to 1:4.

7. The method for forming a deflection grating as claimed in claim 1, wherein said semiconductor substrate is etched with $CH_4/H_2$.

8. The method for forming a deflection grating as claimed in claim 1, wherein the etch selectivity of said dielectric layer and said semiconductor substrate is 1:20.

* * * * *